(12) United States Patent
Henriks

(10) Patent No.: US 12,512,343 B2
(45) Date of Patent: Dec. 30, 2025

(54) APPARATUS FOR DISPENSING A LIQUID

(71) Applicant: LAM RESEARCH AG, Villach (AT)

(72) Inventor: Karl David Henriks, Villach (AT)

(73) Assignee: LAM RESEARCH AG, Villach (AT)

( * ) Notice: Subject to any disclaimer, the term of this patent is extended or adjusted under 35 U.S.C. 154(b) by 124 days.

(21) Appl. No.: 18/274,846

(22) PCT Filed: Feb. 1, 2022

(86) PCT No.: PCT/EP2022/052365
§ 371 (c)(1),
(2) Date: Jul. 28, 2023

(87) PCT Pub. No.: WO2022/167426
PCT Pub. Date: Aug. 11, 2022

(65) Prior Publication Data
US 2024/0136209 A1 Apr. 25, 2024
US 2024/0234182 A9 Jul. 11, 2024

(30) Foreign Application Priority Data
Feb. 2, 2021 (GB) ...................... 2101428

(51) Int. Cl.
*B05C 9/12* (2006.01)
*B05C 11/10* (2006.01)
*B05C 13/02* (2006.01)
*H01L 21/67* (2006.01)

(52) U.S. Cl.
CPC ............ *H01L 21/6715* (2013.01); *B05C 9/12* (2013.01); *B05C 11/1013* (2013.01); *B05C 13/02* (2013.01); *H01L 21/67017* (2013.01); *H01L 21/67051* (2013.01); *H01L 21/6708* (2013.01); *H01L 21/67253* (2013.01)

(58) Field of Classification Search
None
See application file for complete search history.

(56) References Cited

U.S. PATENT DOCUMENTS

| 5,722,441 A | 3/1998 | Teramoto |
| 9,799,539 B2 | 10/2017 | Camargo |
| 11,658,048 B2 | 5/2023 | Lee et al. |
| 2010/0212814 A1 | 8/2010 | Yamamoto |
| 2015/0328668 A1 | 11/2015 | Koyama et al. |
| 2015/0364345 A1 | 12/2015 | Camargo |

(Continued)

FOREIGN PATENT DOCUMENTS

| JP | H05285436 A | 11/1993 |
| KR | 20190024722 A | 3/2019 |

(Continued)

OTHER PUBLICATIONS

International Search Report and Written Opinion of the ISA issued in PCT/EP2022/052365, mailed May 11, 2022; ISA/EP.

(Continued)

*Primary Examiner* — Levon J Shahinian

(57) ABSTRACT

An apparatus for dispensing a liquid comprising: a supply flow path; a pressurised liquid source arranged to supply pressurised liquid to the supply flow path; a junction downstream of the pressurised liquid source, wherein at the junction the supply flow path is branched into a dispense flow path and a return or drain flow path; and a valve or pump in the return or drain flow path downstream of the junction.

22 Claims, 9 Drawing Sheets

(56) References Cited

U.S. PATENT DOCUMENTS

| | | |
|---|---|---|
| 2016/0233082 A1 | 8/2016 | Yano et al. |
| 2017/0345681 A1 | 11/2017 | Mui et al. |
| 2018/0236510 A1 | 8/2018 | Osada et al. |
| 2019/0308223 A1 | 10/2019 | Miyazaki et al. |

FOREIGN PATENT DOCUMENTS

| | | |
|---|---|---|
| WO | WO-2009098554 A1 | 8/2009 |
| WO | WO-2020059385 A1 | 3/2020 |
| WO | 2022167426 A1 | 8/2022 |

OTHER PUBLICATIONS

GB Search Report of the Intellectual Property Office issued in Application No. GB2101428.7, dated Jun. 4, 2021.
Office Action issued in corresponding Korean App. No. 20237029882 dated Nov. 3, 2025.

APPARATUS FOR DISPENSING A LIQUID

CROSS-REFERENCE TO RELATED APPLICATIONS

This application is a U.S. National Phase Application under 35 U.S.C. 371 of International Application No. PCT/EP2022/052365, filed on Feb. 1, 2022, which claims the benefit of Great Britain Patent Application No. GB 2101428.7, filed on Feb. 2, 2021. The entire disclosures of the applications referenced above are incorporated herein by reference.

FIELD OF THE INVENTION

The present invention relates to an apparatus for dispensing a liquid, in particular an apparatus for dispensing a liquid to an apparatus for liquid treatment of a wafer such as a semiconductor wafer.

BACKGROUND OF THE INVENTION

Wafers such as semiconductor wafers may be subjected to various surface treatment processes, such as etching, cleaning, polishing and material deposition.

At least some of these surface treatment processes involve applying a liquid to a surface of the wafer. For example, the surface of the wafer may be etched by applying a processing liquid such as hydrofluoric acid to selected locations on the surface of the wafer. Alternatively, the surface of the wafer may be cleaned by applying a cleaning liquid or rinse liquid such as isopropyl alcohol or de-ionised water to the surface of the wafer.

The wafer may be spun when the liquid is applied to the surface of the wafer, for example using a rotatable chuck that holds the wafer, to assist the distribution of the liquid over the surface of the wafer. Where the liquid is a cleaning liquid or a rinse liquid, such a process may be referred to as a spin-clean process.

In addition, the surface of the wafer may subsequently be dried by heating the wafer to cause evaporation of the liquid on the surface of the wafer.

An example of an apparatus that may be used for liquid treatment of a semiconductor wafer is described in US2017/0345681A1, the contents of which are incorporated herein by reference.

A further example of an apparatus that may be used for liquid treatment of a semiconductor wafer is described in U.S. Pat. No. 9,799,539B2, the contents of which are also incorporated herein by reference.

FIG. 1 is a simplified schematic illustration of an apparatus 1 for liquid treatment of a wafer W, such as a semiconductor wafer.

As shown in FIG. 1, the apparatus 1 comprises a chuck 2 for holding a wafer W. For example, the chuck 2 may comprise a series of gripping pins that grip an outer edge of the wafer W to hold the wafer on the chuck 2.

The chuck 2 is mounted on a rotatable shaft 3, which can be driven to rotate by a motor. Therefore, the chuck 2 and thus the wafer W held by the chuck 2 can be driven to rotate. The chuck 2 may therefore be referred to as a spin chuck.

In practice, the chuck 2 will be positioned within a processing chamber, to isolate the processing environment around the wafer W from an external environment.

As shown in FIG. 1, a liquid dispenser 4 is positioned above the chuck 2, for selectively dispensing liquid onto an upper surface of the wafer W.

The liquid dispenser 4 comprises a liquid dispenser arm 5 that is connected to a supply of a processing liquid. The supply of the processing liquid is generally indicated by element 6 in FIG. 1, and will be described in more detail below with reference to FIG. 2.

The liquid dispenser arm 5 comprises a nozzle 7 at its distal end. Processing liquid is dispensed from the liquid dispenser 4 onto the surface of the wafer W via the nozzle 7.

The liquid dispenser arm 5 includes a flow passage for providing the processing liquid to the nozzle 7 from the supply of the processing liquid 6.

The liquid dispenser arm 5 is preferably pivotable or movable linearly to a standby position in which it does not overlie the wafer W, to facilitate loading and unloading of the wafer W on the chuck 2.

Generally, a controller controls the overall operation of the chuck 2, including coordinating the action of the motor to rotate the chuck 2 and the action of the liquid dispenser 4 to dispense processing liquid from the supply of the processing liquid 6, so that processing liquid is controllably dispensed onto the surface of the wafer W while the wafer W is rotated.

In general, a heating arrangement will be provided to selectively heat the wafer W to evaporate the processing liquid after the processing of the wafer W. For example, an array of LED heating elements may be located within the chuck 2 and arranged to heat an underside of the wafer W held by the chuck 2.

An existing arrangement for supplying processing liquid to the apparatus 1 is illustrated in FIG. 2 (which may correspond to the supply of processing liquid 6 in FIG. 1).

As illustrated in FIG. 2, the existing arrangement comprises a tank 8, a pump 9, a heater 10 and a filter 11.

The tank 8 stores a supply of the processing liquid. The pump 9 is operable to pump the processing liquid out of the tank 8 and to pump the processing liquid to the heater 10 and then to the filter 11. The heater 10 heats the processing liquid to a desired temperature. The filter 11 filters solid particles from the heated processing liquid. Where present, solid particles in the processing liquid may cause the nozzle 7 of the liquid dispenser 4 to become blocked, preventing the liquid dispenser 4 from functioning correctly. Alternatively, or in addition, particles in the processing liquid may interfere with the correct processing of the wafer W, and/or contaminate or damage the wafer W.

The tank 8, pump 9, heater 10 and filter 11 are connected together in series by one or more flow paths (tubes or passageways). An outlet of the filter 11 is connected by a flow path 12 (tube or passageway) to an inlet of the tank 8, thereby forming a loop flow path or ring-line that consists of the flow path 12 and the series connection of the tank 8, pump 9, heater 10 and filter 11.

Processing liquid pumped out of the tank 8 by the pump 9 is circulated around the loop flow path by the pump 9, and returns to the tank 8 after passing through the heater 10, filter 11 and flow path 12.

The apparatus 1 is connected to the loop flow path by a further flow path 13 that is branched off from the flow path 12 at a junction 14.

A valve 15 is positioned on the further flow path 13, and can be controlled to open or close.

When the valve 15 is open, processing liquid can flow from the loop flow path to the apparatus 1. In particular, when the valve 15 is open processing liquid is supplied to the liquid dispenser 4 of the apparatus 1.

When the valve 15 is closed, processing liquid is prevented from flowing from the loop flow path to the apparatus 1. In particular, when the valve 15 is closed processing liquid is not supplied to the liquid dispenser 4 of the apparatus 1.

As illustrated in FIG. 2, a plurality of the apparatus 1 are connected to the loop flow path at respective junctions 14 by respective further flow paths 13 that include respective valves 15, so that a plurality of the apparatus 1 for liquid treatment of a wafer W can be supplied with processing liquid from a single tank 8 via the loop flow path by controlling the respective valves 15 appropriately.

SUMMARY OF THE INVENTION

With the existing arrangement for supplying processing liquid to the apparatus 1 for liquid treatment of a wafer W illustrated in FIG. 2, it has been discovered that solid particles can still be present in the processing liquid supplied to the apparatus 1, despite the presence of the filter 11.

The present inventors have identified the valve 15 on the further flow path 13 as being a source of solid particles. In particular, mechanical movement of components of the valve 15 when opening and closing the valve 15 can cause the generation of solid particles, for example due to wear of components of the valve 15 due to friction. Since the valve 15 is located downstream of the filter 11 and upstream of the apparatus 1, such particles are supplied directly to the apparatus 1 without being filtered out.

The present invention aims to reduce an amount of solid particles in the processing liquid supplied to the apparatus 1.

More generally, the present invention aims to provide an apparatus for dispensing a liquid in which an amount of solid particles in the liquid is reduced.

According to the present invention there is provided an apparatus for dispensing a liquid comprising: a supply flow path; a pressurised liquid source arranged to supply pressurised liquid to the supply flow path; a junction downstream of the pressurised liquid source, wherein at the junction the supply flow path is branched into a dispense flow path and a return or drain flow path; and a valve or pump in the return or drain flow path downstream of the junction.

With the apparatus of the present invention, an amount of liquid that flows from the supply flow path into the dispense flow path can be controlled by controlling the flow of liquid through the return or drain flow path using the valve or pump.

Therefore, dispensing of liquid along the dispense flow path can be controlled by controlling the valve or pump on the return or drain flow path.

Importantly, the valve or pump is located on the return or drain flow path downstream of the junction. Therefore, any solid particles that are generated by operation of the valve do not enter the dispense flow path. An amount of solid particles in the liquid in the dispense flow path can therefore be reduced.

For example, with the apparatus of the present invention it may be possible to have no moving parts between the pressurised liquid source and the apparatus for liquid treatment of the wafer. For example, there may be no moving parts between the pressurised liquid source and the liquid dispenser and/or nozzle of the apparatus for liquid treatment of the wafer. Therefore, substantially no solid particles may be generated in the flow path between the pressurised liquid source and the liquid dispenser and/or nozzle of the apparatus for liquid treatment of the wafer.

Therefore, an amount of solid particles in liquid dispensed onto the wafer in the apparatus for liquid treatment of a wafer can be reduced.

The apparatus according to the present invention may have any one, or where compatible any combination of, the following optional features.

The term apparatus for dispensing a liquid may be replaced with the term device, system or arrangement for dispensing a liquid.

Dispensing a liquid may mean supplying or providing a liquid.

The liquid may be a processing liquid or a treatment liquid.

The apparatus according to the present invention may be for dispensing the liquid to an apparatus for liquid treatment of a wafer, or processing a wafer, such as a semiconductor wafer. For example, the dispense flow path of the apparatus may be connected to an apparatus for liquid treatment of a wafer so that liquid that flows along the dispense flow path is dispensed to the apparatus for liquid treatment of a wafer. For example, the dispense flow path may be connected (directly or via one or more other parts) to a liquid dispenser of the apparatus that is used to dispense liquid on a surface of the wafer.

A flow path may mean one or more tubes, passageways, ducts or channels along which the liquid can flow.

A flow path may comprise a single tube, passageway, duct or channel, or more than one of these connected together.

A pressurised liquid source means one or more parts, components, devices or apparatus that provide a supply of pressurised liquid.

At the junction, the supply flow path is branched into the dispense flow path and the return or drain flow path.

The term junction may merely mean a location or point at which the supply flow path, dispense flow path and return or drain flow path are connected.

The supply flow path being branched into the dispense flow path and the return or drain flow path may mean that the supply flow path is split into the dispense flow path and the return or drain flow path, or is divided into the dispense flow path and the return or drain flow path, or is connected to the dispense flow path and the return or drain flow path.

One or more of the supply flow path, dispense flow path and return or drain flow path may be integrally formed, or may be attached or connected together.

The supply flow path ends at the junction. The junction is therefore located at a downstream end of the supply flow path.

The dispense flow path and the return or drain flow path start at the junction. The junction is therefore located an upstream ends of both the dispense flow path and the return or drain flow path.

At the junction, a flow path or fluid connection is provided between the supply flow path and the dispense flow path, such that it is possible for liquid to flow from the supply flow path to the dispense flow path at the junction.

At the junction, a flow path or fluid connection is provided between the supply flow path and the return or drain flow path, such that it is possible for liquid to flow from the supply flow path to the return or drain flow path at the junction.

The junction being downstream of the pressurised liquid source means that the pressurised liquid flows from an outlet of the pressurised liquid source to the junction (directly or indirectly via one or more other parts).

The dispense flow path is a flow path along which liquid can be dispensed from the apparatus.

Typically, the dispense flow path is connected to an apparatus for liquid treatment of a wafer, so that liquid that is dispensed along the dispense flow path is provided to the apparatus. For example, the dispense flow path may be connected to a liquid dispenser of the apparatus, from which the liquid is dispensed onto a surface of a wafer to liquid treat the wafer.

The return or drain flow path may be a drain flow path that supplies the liquid to a container, or to another apparatus, or to another device. The liquid may subsequently be recycled from the container, or in another apparatus or another device.

Alternatively, the return or drain flow path may be a return flow path that returns the liquid to the pressurised liquid source. Therefore, liquid may be circulated, for example continuously circulated, by the pressurised liquid source.

The supply flow path and return flow path may be parts of a loop flow path around which the liquid is circulated by the pressurised liquid source.

A loop flow path may mean a flow path around which liquid can be circulated.

A loop flow path may mean a flow path that starts and ends at the same part or location.

The specific shape of the loop flow path is not essential to the present invention.

As a frame of reference, the loop flow path may be said to start at an outlet of the pressurised liquid source.

The pressurised liquid source is typically located on the loop flow path, such that the loop flow path connects an outlet of the pressurised liquid source to an inlet of the pressurised liquid source.

The pressurised liquid source provides a force to the liquid to cause the liquid to flow around the loop flow path.

Circulating the liquid around the loop flow path means that the liquid flows around the loop flow path.

Circulating the liquid around the loop flow path may mean that the liquid flows around the loop flow path multiple times.

As mentioned above, an amount of liquid that flows from the supply flow path into the dispense flow path can be controlled by controlling the flow of liquid through the return or drain flow path using the valve or pump on the return or drain flow path.

The apparatus may comprise the valve in the return or drain flow path downstream of the junction.

The term valve may mean any device that can be used to control the flow rate of the liquid along the loop flow path. The term valve may instead be replaced with the term variable restriction, or variable obstruction, or flow path constrictor, or flow rate adjuster, or flow rate regulator, or flow rate controller.

Various different types of valve may be used as the valve in the present invention.

For example, the valve may be an on-off, or open-close, or shut-off valve. In particular, the valve may be operable between only two states—an open state in which the valve allows flow of the liquid along the return or drain flow path, and a closed state in which the valve prevents flow of the liquid along the return or drain flow path.

In that case, when the valve is closed (i.e. flow of the liquid along the return or drain flow path is blocked), the liquid cannot flow along the return or drain flow path and therefore instead flows from the supply flow path into the dispense flow path. In contrast, if the valve is open, the liquid flows from the supply flow path into the return or drain flow path and does not flow into the dispense flow path.

Alternatively, or in addition, the valve may be operable to vary an amount of opening or closing of the valve. For example, the valve may be operable to variable control a flow rate of the liquid in the return or drain flow path, for example by varying a degree of obstruction of the return or drain flow path, so that the flow rate of the liquid in the return or drain flow path can be controlled to be one of a plurality of different flow rates.

In that case, operating the valve to partially block the return or drain flow path by a sufficient amount (i.e. the valve is partially closed/partially open by a sufficient amount) may cause part of the liquid from the supply flow path to flow through the return or drain flow path and part of the liquid from the supply flow path to flow into the dispense flow path. An amount of the liquid that flows from the supply flow path into the dispense flow path may be controlled or regulated by controlling or regulating an amount of closing/opening of the valve. For example, the valve may be adjustable to controllably vary a cross-sectional area though which the liquid can flow. This may be achieved by using a flow regulating valve/flow controlling valve, for example.

Alternatively, the apparatus may comprise the pump in the return or drain flow path downstream of the junction.

The pump is operable to apply a force or pressure to the liquid in the return or drain flow path to cause the liquid to flow along the return or drain flow path away from the junction.

Various different types of pump may be used as the pump in the present invention.

For example, the pump may be an on-off pump. In particular, the pump may be operable between only two states—an on state in which the pump applies the force or pressure to the liquid in the return or drain flow path and an off state in which the pump does not provide the force or pressure to the liquid. In the off state, the pump may prevent or restrict liquid from flowing along the return or drain flow path.

In that case, when the pump is off (i.e. the pump does not provide the force or pressure to the liquid, and/or the pump prevents or restricts flow of liquid along the return or drain flow path), flow of liquid along the return or drain flow path is limited or prevented. Therefore, some of all of the liquid instead flows from the supply flow path into the dispense flow path. In contrast, when the pump is on (i.e. the pump does provide the force or pressure to the liquid), the flow rate of the liquid in the return or drain flow path is sufficiently high that the liquid does not flow from the supply flow path into the dispense flow path.

Alternatively, or in addition, the pump may be operable to vary a force or pressure applied to the liquid in the return or drain flow path. For example, the pump may be operable to variably control a flow rate of the liquid in the return or drain flow path, by varying an amount of force or pressure applied to the liquid in the return or drain flow path, so that the flow rate of the liquid in the return or drain flow path can be controlled to be one of a plurality of different flow rates.

In that case, operating the pump to provide a predetermined force or pressure to the liquid in the return or drain flow path may cause part of the liquid from the supply flow path to flow through the return or drain flow path and part of the liquid from the supply flow path to flow into the dispense flow path. An amount of the liquid that flows from the supply flow path into the dispense flow path may be controlled or regulated by controlling or regulating an amount of force or pressure applied to the liquid in the return or drain flow path by the pump.

The valve or pump being downstream of the junction means that the liquid flows from an outlet of the pressurised liquid source to the junction before flowing to the valve or pump.

The pressurised liquid source may comprise a pump (which may be referred to as a further pump, or a source pump). The pump may be operable to pump liquid into the supply flow path. An outlet of the pump may be an outlet of the pressurised liquid source The pressurised liquid source may comprise a container of the liquid, for example a tank of the liquid. An inlet of the container or an inlet of the pump may be an inlet of the pressurised liquid source.

For example, the pressurised liquid source may comprise a pump, an inlet of which is connected (directly or indirectly via one or more other parts) to a container of the liquid and an outlet of which is connected (directly or indirectly via one or more other parts) to the supply flow path. The pump is therefore operable to pump liquid from the container to the supply flow path.

Where the return or drain flow path is a return flow path, the return flow path may connect to an inlet of the container. Therefore, liquid that has been pumped to the supply flow path and not dispensed along the dispense flow path may return to the container where it can again be pumped to the supply flow path by the pump. In this manner, the liquid can be circulated. Alternatively, the return flow path may connect to an inlet of the pump.

Alternatively, the pressurised liquid source may comprise a container (or tank) of the liquid at an elevated position. The pressure of the pressurised liquid may therefore be a hydrostatic pressure, due to the weight of the liquid in the elevated container.

An elevated position may mean a position that is higher than a position of a liquid dispenser of an apparatus for liquid treatment of a wafer connected to the dispense flow path.

Alternatively, an elevated position may mean a position that is higher than a highest position reached by the dispense flow path.

Where the apparatus comprises the return flow path, the apparatus may comprise the pump in the return flow path to pump the liquid in the return flow path back to the container of the liquid at the elevated position.

The apparatus may comprise a filter arranged to filter particles from the pressurised liquid supplied to the supply flow path, the filter being upstream of the junction.

The filter typically includes a filter material, for example a mesh, through which the liquid flows and that filters (removes) solid particles from the liquid.

The filter may be arranged between an outlet of the pressurised liquid source and the junction.

The filter is typically a separate component to pressurised liquid source, but may instead be incorporated into the pressurised liquid source. For example, the filter may be located in the pressurised liquid source (for example a pump) at an outlet of the pressurised liquid source. Preferably the filter is located after a mechanism of the pressurised liquid source so as to filter out any solid particles that may be produced by the mechanism of the pressurised liquid source.

In practice, the junction is configured so that when the pressurised liquid is supplied to the supply flow path, and the valve or pump is operated in a predetermined manner, the liquid flows into the return or drain flow path and flow of the liquid into the dispense flow path is prevented or restricted.

For example, the shape and/or orientation of the junction may be configured so that when the pressurised liquid is supplied to supply flow path, and the valve or pump is operated in the predetermined manner, flow of the liquid into the dispense flow path is prevented or restricted.

Operating the valve in the predetermined manner may comprise opening the valve, or opening the valve more than a predetermined amount.

Operating the pump in the predetermined manner may comprise turning the pump on, or controlling the pump to provide a force or pressure to the liquid in the return or drain flow path that is greater than a predetermined amount.

For example, the junction may include a narrowing or constriction (a venturi) between the supply flow path and the return or drain flow path, wherein the velocity of the liquid flowing from the supply flow path to the return or drain flow path is increased in the narrowing or constriction and the pressure of the liquid flowing from the supply flow path to the return or drain flow path is reduced in the narrowing or constriction (due to the venturi effect); and the narrowing or constriction may be arranged so that the reduced pressure prevents or restricts flow of the liquid into the dispense flow path.

For example, the narrowing or constriction may be located where the dispense flow path is connected to the supply flow path in the junction, for example adjacent to an entrance of the dispense flow path, so that the lower pressure occurs adjacent to the entrance of the dispense flow path. The lower pressure acts to prevent liquid from flowing into the dispense flow path from the junction.

Alternatively, or in addition, the dispense flow path may be oriented so that gravity acts on the liquid to prevent or restrict the liquid from flowing from the junction along the dispense flow path.

For example, the dispense flow path may extend upwards (directly or at an angle) from the junction, so that force on the liquid due to gravity acts downwards. This force may prevent or restrict the liquid from flowing from the junction along the dispense flow path.

For example, at the junction the dispense flow path may be oriented: substantially vertically; or angled upwards at an angle of less than 10 degrees to the vertical; or angled upwards at an angle of less than 20 degrees to the vertical; or angled upwards at an angle of less than 30 degrees to the vertical; or angled upwards at an angle of less than 40 degrees to the vertical; or angled upwards at an angle of less than 50 degrees to the vertical; or angled upwards at an angle of less than 60 degrees to the vertical.

In addition, or alternatively, the supply flow path and/or the return or drain flow path may be oriented so that gravity acts on the liquid to prevent or restrict the liquid from flowing from the junction along the dispense flow path.

For example, at an inlet to the junction the supply flow path may be oriented: substantially vertically downward; or angled downward at an angle of less than 10 degrees to the vertical; or angled downward at an angle of less than 20 degrees to the vertical; or angled downward at an angle of less than 30 degrees to the vertical; or angled downward at an angle of less than 40 degrees to the vertical; or angled downward at an angle of less than 50 degrees to the vertical; or angled downward at an angle of less than 60 degrees to the vertical.

Alternatively, or in addition, at an outlet of the junction the return or drain flow path may be oriented: substantially vertically downward; or angled downward at an angle of less than 10 degrees to the vertical; or angled downward at an angle of less than 20 degrees to the vertical; or angled downward at an angle of less than 30 degrees to the vertical; or angled downward at an angle of less than 40 degrees to the vertical; or angled downward at an angle of less than 50 degrees to the vertical; or angled downward at an angle of less than 60 degrees to the vertical.

For example, where both the supply flow path and the return or drain flow path are substantially vertically downward at the inlet and the outlet of the junction, both the momentum of the liquid and gravity will cause the liquid to flow from the supply flow path into the return or drain flow path through the junction.

The supply flow path and the return or drain flow path may form substantially a straight line across the junction, for example a straight line vertically downwards.

In addition, or alternatively, at the junction the dispense flow path may be angled relative to the direction of flow of the liquid in the supply flow path so as to prevent or restrict the liquid from flowing from the junction along the dispense flow path.

For example, where the dispense flow path is angled in the opposite direction to the direction of flow of the liquid in the supply flow path, the momentum of the liquid may cause the liquid to continue to flow along the supply flow path and not into the dispense flow path.

For example, at the junction the dispense flow path may be angled relative to the direction of flow of the liquid in the supply flow path by an angle of more than 90 degrees, or more that 100 degrees, or more than 110 degrees, or more than 120 degrees, or more than 130 degrees, or more than 140 degrees, or more than 150 degrees, or more than 160 degrees, or more than 170 degrees.

The junction may comprise a Y-fitting or a T-fitting.

In a preferred arrangement, there are no valves between the pressurised liquid source and the dispense flow path, and no valves on the dispense flow path.

There may be therefore be no valves between the pressurised liquid source and an apparatus for liquid treatment of a wafer connected to the dispense flow path.

There may be no valves between the pressurised liquid source and a nozzle of a liquid dispenser of the apparatus for processing a wafer connected to the dispense flow path.

There may be no moving parts between the pressurised liquid source and an apparatus for processing a wafer connected to the dispense flow path.

There may be no moving parts between the pressurised liquid source and a nozzle of a liquid dispenser of the apparatus for processing a wafer connected to the dispense flow path.

The liquid dispenser of the apparatus for liquid treatment of a wafer may comprise a needle valve in the dispense flow path (e.g. in the nozzle of the liquid dispenser). Such a type of valve may not generate a significant amount of solid particles, and may prevent dripping of liquid from the nozzle at the end of the liquid treatment.

The apparatus may comprise a flow meter arranged to measure a flow rate of the liquid flowing through the dispense flow path; the valve or pump may be operable to adjust a flow rate of the liquid flowing in the return or drain flow path; and the apparatus may comprise a controller that is configured to control the valve or pump to adjust the flow rate of the liquid flowing in the return or drain flow path based on a measurement output of the flow meter.

For example, the apparatus may comprise the valve in the return or drain flow path, and the valve may be a flow rate control valve.

A degree of opening or closing of the valve may be varied to vary a flow rate of the liquid through the return or drain flow path.

Alternatively, the apparatus may comprise the pump in the return or drain flow path, and pump may be controllable to vary a force or pressure applied to the liquid in the return or drain flow path so as to vary to flow rate of the liquid in the return or drain flow path.

The controller may control the operation of the valve or pump based on an output of the flow meter and on a target flow rate of the liquid along the dispense flow path.

In particular, the controller may be configured to control the valve or pump to adjust the flow rate of the liquid flowing through the return or drain flow path to achieve a target flow rate of the liquid flowing through the dispense flow path.

For example, when the apparatus is operated to liquid treat the wafer, the apparatus may aim to provide a specific amount of the liquid onto the surface of the wafer, or a specific flow rate of the liquid onto the surface of the wafer.

A target flow rate for the liquid in the dispense flow path may be determined by the controller or may be provided to the controller, and the controller may control an amount of opening or closing of the valve, or an amount of force or pressure applied to the liquid by the pump, based on this target flow rate. For example, the controller may control the valve to be completely closed, or partly closed. The amount of opening or closing of the valve, or the amount of force or pressure applied to the liquid by the pump, required for the target flow rate may be predetermined in advance. For example, the controller may include, or have access to, a predetermined relationship between the target flow rate in the dispense flow path and a corresponding amount of opening or closing of the valve, or the target flow rate in the dispense flow path and a degree of operation of the pump (amount of force or pressure applied to the liquid by the pump).

The actual flow rate of the liquid in the dispense flow path may then be measured by the flow meter. Based on comparison of the measurement of the flow rate with the target flow rate, the controller may adjust an amount of opening or closing of the valve, or an amount of force or pressure applied to the liquid by the pump, to achieve the target flow rate in the dispense flow path.

For example, where the flow rate in the dispense flow path is lower than the target flow rate, an amount of closure of the valve can be increased, or the amount of force or pressure applied to the liquid by the pump can be decreased, so that more of the liquid is diverted to the dispense flow path and the flow rate in the dispense flow path is therefore increased.

Conversely, when the flow rate in the dispense flow path is too high, an amount of opening of the valve can be increased, or the amount of force or pressure applied to the liquid by the pump can be increased, so that less of the liquid is diverted to the dispense flow path and the flow rate in the dispense flow path is therefore decreased.

The valve or pump, flow meter and controller may therefore provide a control loop for controlling the flow rate in the dispense flow path.

The apparatus may comprise a plurality of the supply flow paths, each with a respective one of the junction, dispense flow path, return or drain flow path, and valve or pump.

Therefore, the apparatus may be able to dispense liquid to a plurality of apparatus for liquid treatment of a wafer via the plurality of supply flow paths.

A single pressurised liquid source may supply pressurised liquid to each of the plurality of plurality of supply flow paths.

The plurality of return or drain flow paths may comprise a plurality of drain flow paths each connected to the same container or another apparatus or another device.

The plurality of return or drain flow paths may comprise a plurality of return flow paths each connected to the inlet of a single pressurised liquid source.

A single filter may also be used to filter the pressurised liquid supplied to each of the supply flow paths.

The plurality of supply flow paths may be provided by a manifold that connects a single input flow path that is connected (directly or indirectly via one or more other parts) to the pressurised liquid source to the plurality of supply flow paths.

The manifold is downstream of the pressurised liquid source.

The apparatus may include an apparatus for liquid treatment of a wafer connected to the dispense flow path.

Alternatively, there may be provided a system or arrangement comprising the apparatus for dispensing a liquid and an apparatus for liquid treatment of a wafer connected to the dispense flow path of the apparatus for dispensing a liquid.

Where there are a plurality of the supply flow paths, the apparatus may include a plurality of apparatus for liquid treatment of a wafer, each connected to a respective one of the dispense flow paths.

Alternatively, there may be provided a system or arrangement comprising the apparatus for dispensing a liquid and a plurality of apparatus for liquid treatment of a wafer, each connected to a respective one of the dispense flow paths of the apparatus for dispensing a liquid.

BRIEF DESCRIPTION OF THE DRAWINGS

Embodiments of the present invention will now be discussed, by way of example only, with reference to the accompanying figures, in which.

DETAILED DESCRIPTION OF THE PREFERRED EMBODIMENTS AND FURTHER OPTIONAL FEATURES OF THE INVENTION

Aspects and embodiments of the present invention will now be discussed with reference to the accompanying figures. Further aspects and embodiments will be apparent to those skilled in the art. All documents mentioned in this text are incorporated herein by reference.

Figure 3:
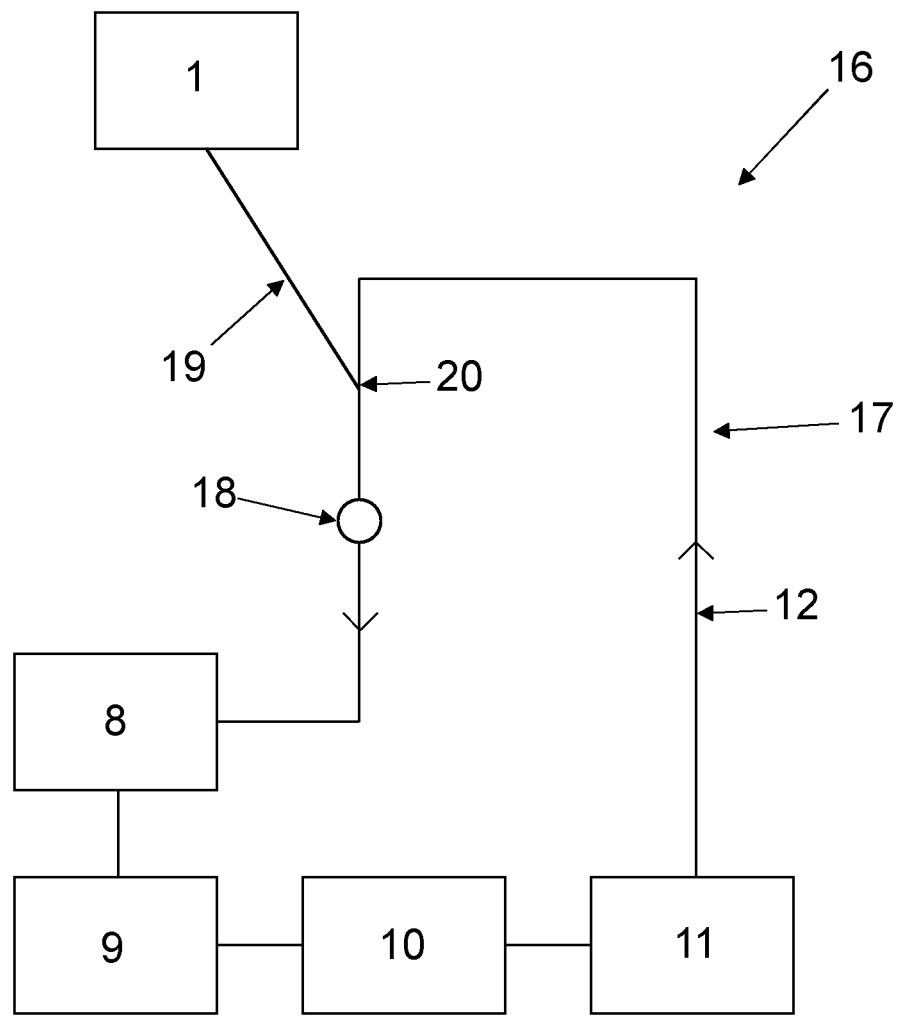
FIG. 3 is a schematic illustration of an apparatus for dispensing liquid according to an embodiment of the present invention.

An apparatus for dispensing a liquid to an apparatus for liquid treatment of a wafer according to an embodiment of the present invention is illustrated in FIG. 3.

As illustrated in FIG. 3, the apparatus 16 comprises a tank 8, a pump 9, a heater 10 and a filter 11. The tank 8, pump 9, heater 10 and filter 11 may have any of the features of the existing arrangement discussed above.

The tank 8 stores a reservoir of the liquid to be dispensed. The pump 9 is operable to pump the liquid out of the tank 8 and to pump the liquid to the heater 10 and the filter 11. The heater 10 heats the liquid to a desired temperature. The filter 11 filters solid particles from the liquid.

The tank 8, pump 9, heater 10 and filter 11 are connected together in series by one or more flow paths (tubes or passageways).

As indicated in FIG. 3, an outlet of the filter 11 is connected by a flow path 12 to an inlet of the tank 8. Therefore, a loop flow path 17 (a flow path around which the liquid can circulate) is formed by the flow path 12 and the series connection of the tank 8, pump 9, heater 10 and filter 11. Liquid that is pumped out of the tank 8 by the pump 9 can therefore be circulated around the loop flow path 17 and returned to the tank 8.

For example, the pump 9 may be connected to an outlet of the tank 8 at or adjacent to a bottom of the tank 8, whereas the flow path 12 may be connected to an inlet of the tank 8 at or adjacent to a top of the tank 8. Of course, the inlet and outlet may be located elsewhere on the tank 8.

The specific shape of the loop flow path 17 is not essential to the present invention, and in practice will be different to the specific shape illustrated in the figures.

Of course, in other embodiments the heater 10 may be omitted, or a cooler may be alternatively used. Specifically, heating of the liquid is not essential to the present invention.

In addition, in other embodiments the filter 11 may also be omitted.

In addition, or alternatively, the order of the pump 9, heater 10 and filter 11 in the loop flow path 17 may be different to that illustrated in the figures.

In addition, or alternatively, although the tank 8, pump 9, heater 10 and filter 11 are illustrated as separate components in FIG. 3, this is not necessary, and instead these components may be combined together in one or more devices or apparatus. For example, the filter 11 may be included in the tank 8, pump 9 or heater 10.

As shown in FIG. 3, a dispense flow path 19 is connected to the flow path 12 at a junction 20. The junction 20 is positioned downstream of the filter 11 on the loop flow path 17.

The portion of flow path 12 between the filter 11 and the junction 20 may correspond to a supply flow path, and the portion of flow path 12 between the junction 20 and the tank 8 may correspond to a return flow path.

The tank 8 and pump 9 together form a pressurised liquid supply.

An outlet of the pump 9 may be taken as a start point of the loop flow path 17, as a frame of reference. The junction 20 being positioned downstream of the filter 11 on the loop flow path 17 therefore means that liquid leaving the outlet of the pump 9 reaches the filter before it reaches the junction 20.

Expressed in a different way, the junction 20 is between an outlet of the filter 11 and an inlet of the tank 8 or an inlet of the pump 9.

Furthermore, a valve 18 is provided on the flow path 12 downstream of the junction 20. The valve 18 is positioned downstream of the junction 20 on the loop flow path 17.

The junction 20 is therefore positioned between the filter 11 and the valve 18 on the loop flow path 17.

In this embodiment, the valve 18 can be controlled (for example by a controller) to be either open or closed. However, in alternative embodiments the valve 18 may instead, or in addition, be operable to vary a flow rate of the liquid through the valve (i.e. to provide different amounts of opening or closing of the valve 18).

When the valve 18 is open and the pump 9 is operated to pump liquid from the tank 8, the liquid can flow along the flow path 12 through the valve 18. Therefore, the liquid circulates (flows) around the loop flow path 17.

The junction 20 between the flow path 12 and the dispense flow path 19 is configured so that when the valve 18 is open and the liquid is circulating around the loop flow path 17, flow of the liquid into or along the dispense flow path 19 is restricted or prevented.

In practice, this effect can be achieved in at least one or more of the following ways.

The junction 20 may comprise a venturi (a narrowing or constriction) on the flow path 12, so that the velocity of the liquid flowing around the loop flow path 17 is increased in the venturi and the pressure of the liquid is reduced in the venturi. The venturi is arranged so that the low pressure is experienced adjacent to the entrance to the dispense flow path 19, such that the liquid is restricted from entering the dispense flow path 19. For example, this may be achieved by providing a narrowing or constriction in the flow path 12 adjacent to the entrance to the dispense flow path 19. The narrowing or constriction may comprise a reduction in the diameter of the flow path 12 at the junction 20, and/or a partial obstruction in the flow path 12, and/or an orifice in the flow path 12 at the junction 20.

Alternatively, or in addition, the dispense flow path 19 may be oriented, positioned or arranged so that gravity acts on the liquid to prevent or restrict the liquid from flowing from the junction 20 along the dispense flow path 19. For example, the dispense flow path 19 may extend upwards (substantially vertically or at an angle to the vertical) from the junction 20, so that gravity acts on any liquid that enters the dispense flow path 19 from the junction 20 to prevent the liquid from flowing along the dispense flow path 19. At the junction 20 the dispense flow path 19 may extend substantially vertically upwards, or at an angle of less than 10 degrees to the vertical, or at an angle of less than 20 degrees to the vertical, or at an angle of less than 30 degrees to the vertical, or at an angle of less than 40 degrees to the vertical, or at an angle of less than 50 degrees to the vertical, or at an angle of less than 60 degree to the vertical.

Alternatively, or in addition, the flow path 12 may be oriented, positioned or arranged so that gravity acts on the liquid to prevent or restrict the liquid from flowing from the junction 20 along the dispense flow path 19.

For example, at an inlet to the junction 20 the flow path 12 may be oriented substantially vertically downwards, with the direction of flow of the liquid substantially vertically downwards. In that case, gravity acts on the liquid flowing along the flow path 12 at the junction 20 to cause the liquid to continue to flow along the flow path 12 and not enter the dispense flow path 19. At the junction 20 the flow path 12 may be substantially vertical downwards, or at an angle of less than 10 degrees to the vertical, or at an angle of less than 20 degrees to the vertical, or at an angle of less than 30 degrees to the vertical, or at an angle of less than 40 degrees to the vertical, or at an angle of less than 50 degrees to the vertical.

In addition, or alternatively, at an outlet to the junction 20 the flow path 12 may be oriented substantially vertically downwards, with the direction of flow of the liquid substantially vertically downwards. In that case, gravity acts on the liquid flowing along the flow path 12 at the junction 20 to cause the liquid to continue to flow along the flow path 12 and not enter the dispense flow path 19. At the junction 20 the flow path 12 may be substantially vertically downwards, or at an angle of less than 10 degrees to the vertical, or at an angle of less than 20 degrees to the vertical, or at an angle of less than 30 degrees to the vertical, or at an angle of less than 40 degrees to the vertical, or at an angle of less than 50 degrees to the vertical.

Alternatively, or in addition, the dispense flow path 19 may be angled relative to the direction of flow of the liquid in the loop flow path 17 so as to prevent or restrict the liquid from flowing from the junction 20 along the dispense flow path 19. For example, the dispense flow path 19 may be at an angle of 90 degrees or more relative to the direction of flow of the liquid in the loop flow path 17. For example, the dispense flow path 19 may be at an angle of more than 100 degrees, or more than 110 degrees, or more than 120 degrees, or more than 130 degree, or more than 140 degrees, or more than 150 degrees, or more than 160 degrees, or more than 170 degrees, to the direction of flow of the liquid in the loop flow path 17.

In the embodiment of FIG. 3, the flow path 12 is arranged substantially vertically through the junction 20 (at the inlet and outlet of the junction 20), and the dispense flow path is angled upwards from the junction 20. Gravity therefore acts to cause the liquid to flow through the junction 20 along the flow path 12 when the valve 18 is open, and not to flow along the dispense flow path 19.

In specific examples the junction 20 may comprise a Y-fitting or a T-fitting.

Alternatively, or in addition, the diameter of the tube in the loop flow path 17 may be greater downstream the junction 20 than upstream the junction. This way it is avoided that the liquid could unintentionally flow into the dispense flow path 19.

While the valve 18 is open, and the pump 9 is operated, the liquid circulates around the loop flow path 17 and does not flow along the dispense flow path 19.

In contrast, when the valve 18 is closed, and the pump 9 is operated, the liquid is prevented from returning to the tank 8 along the flow path 12 by the closed valve 18. The liquid therefore cannot circulate around the loop flow path 17. Instead, the only flow path available for the liquid is the dispense flow path 19. The liquid is therefore pumped along the dispense flow path 19 from the junction 20 to the apparatus 1 for liquid treatment of a wafer W.

In particular, in this embodiment the liquid is dispensed by the apparatus 16 along the dispense flow path 19 to a liquid dispenser of the apparatus 1, from which the liquid is dispensed onto a surface of the wafer.

The operation of the valve 18 is therefore controlled so that liquid is controllably dispensed to the apparatus 1 along the flow path 19 when the apparatus 1 is operated to liquid treat a wafer W.

Specifically, when liquid is to be dispensed on the surface of the wafer W, the valve 18 is closed so that liquid circulating in the loop flow path 17 is dispensed to the liquid dispenser of the apparatus 1 along the dispense flow path 19 and dispensed onto the surface of the wafer W.

In contrast, when liquid is not to be dispensed on the surface of the wafer W, the valve 18 is opened so that liquid circulates around the loop flow path 17 and does not flow along the dispense flow path 19.

In the present invention, the valve 18 that controls the dispensing of the liquid along the dispense flow path 19 is located downstream of the junction 20 (between an outlet of the junction 20 and the inlet of the tank 8 or inlet of the pump 9). Therefore, any particles generated by operation of the valve 19 flow away from the junction 20 to the tank 8, and subsequently are filtered by the filter 11. Liquid may therefore flow directly from the filter 11 to the liquid dispenser of the apparatus 1 and onto the wafer W without passing through any valves. In this manner, an amount of solid particles in the liquid supplied to the liquid dispenser of the apparatus and dispensed onto the wafer W can be reduced.

Figure 1:
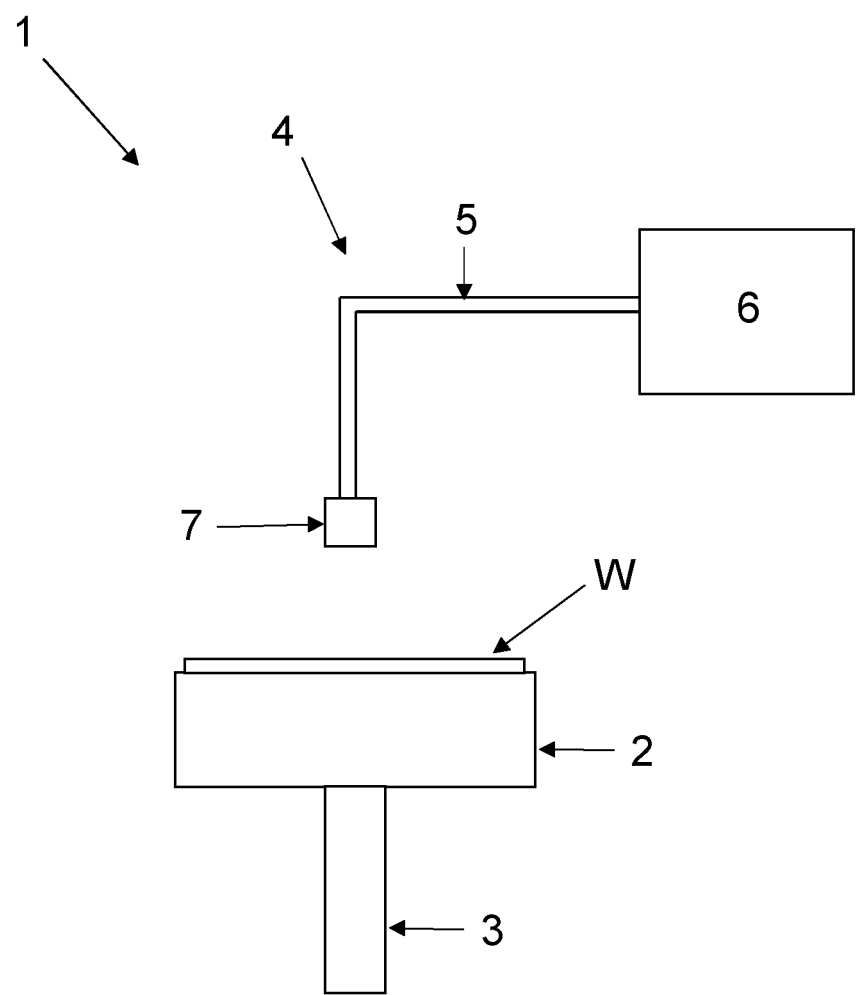
FIG. 1 a simplified schematic illustration of an apparatus for liquid treatment of a wafer.
Figure 2:
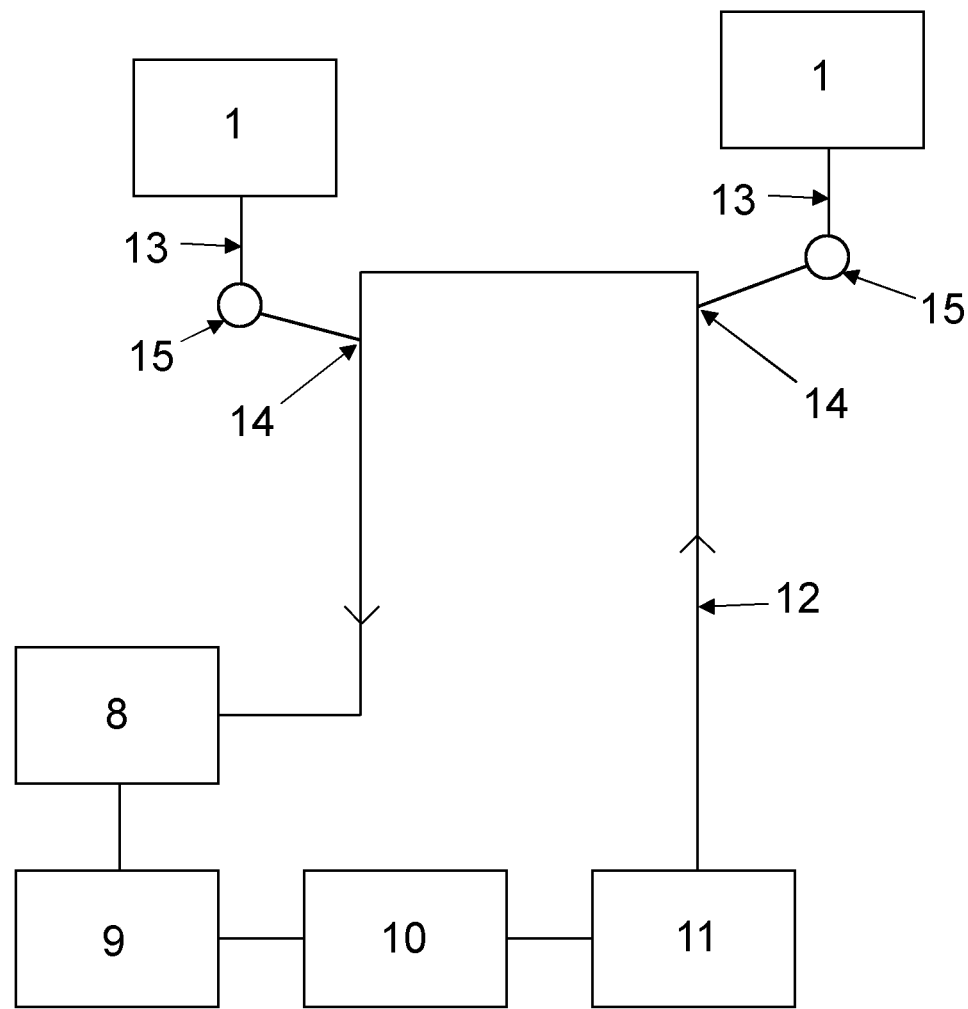
FIG. 2 is a schematic illustration of an existing arrangement for supplying processing liquid to the apparatus illustrated in FIG. 1.

The apparatus 1 to which the liquid is dispensed may be as illustrated in FIG. 1 and as described above, for example. However, the configuration of the apparatus 1 may be different to that illustrated in FIG. 1 and described above.

In general, the apparatus for liquid treatment of a wafer includes a liquid dispenser for dispensing liquid onto a surface of a wafer. The liquid dispenser may have the configuration of the liquid dispenser illustrated in FIG. 1 and described above. For example, the liquid dispenser may comprise a liquid dispenser arm having a nozzle at its distal end for dispensing liquid onto the surface of the wafer. The liquid dispenser arm 5 may include a flow passage for providing the liquid to the nozzle 7 from the dispense flow path 19. However, the liquid dispenser may have a different configuration to that illustrated in FIG. 1.

As shown in FIG. 3, only a single apparatus 1 is connected to the loop flow path 17.

Figure 4:
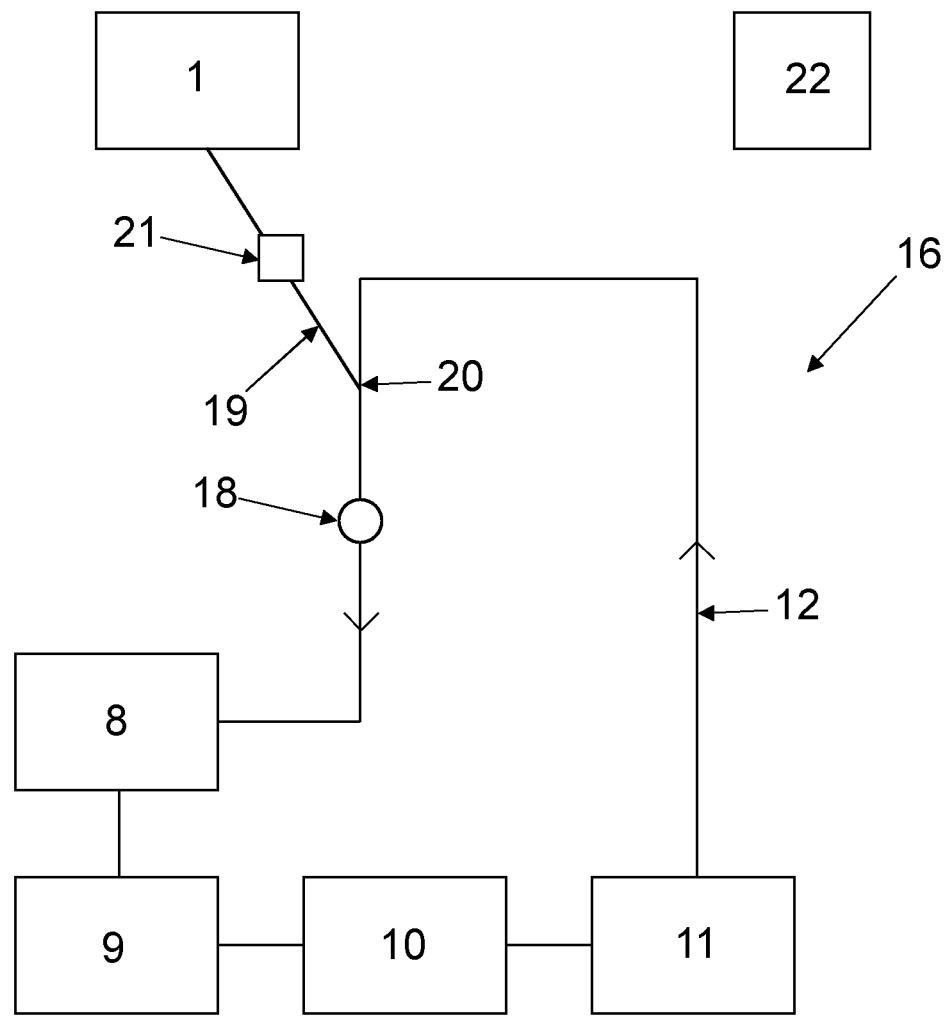
FIG. 4 is a schematic illustration of an apparatus for dispensing liquid according to an embodiment of the present invention.

An apparatus for dispensing a liquid to an apparatus for liquid treatment of a wafer according to a modified embodiment of the present invention is illustrated in FIG. 4. Features of this embodiment that correspond to features of the previous embodiment are indicated with the same reference numbers in FIG. 4, and detailed description thereof is omitted for conciseness.

This embodiment differs from the previous embodiment in that a flow meter 21 is located on the dispense flow path 19. The flow meter 21 measures a flow rate of the liquid in the dispense flow path 19.

In addition, in this embodiment the valve 18 is operable to vary a flow rate of the liquid through the flow path 12. For example, the degree of opening or closing of the valve 18 can be varied to vary a flow rate of the liquid through the flow path. Valve 18 may be a flow rate control valve.

The apparatus further comprises a controller 22 that controls the operation of the valve 21 based on an output of the flow meter 21 and on a target flow rate of the liquid along the dispense flow path.

In particular, when the apparatus 1 is operated to liquid treat the wafer W, the apparatus 1 aims to provide a specific amount of the liquid onto the surface of the wafer W, or a specific flow rate of the liquid onto the surface of the wafer W. A target flow rate for the liquid in the dispense flow path 19 is determined by the controller 22 or is provided to the controller 22, and the controller 22 controls an amount of opening or closing of the valve 18 based on this target flow rate. For example, the controller may control the valve 18 to be completely closed, or 75% closed, or a different amount. The amount of opening or closing of the valve 18 for the target flow rate may be predetermined in advance. For example, the controller may include, or have access to, a predetermined relationship between the target flow rate in the dispense flow path 19 and the amount of opening or closing of the valve 18.

The actual flow rate of the liquid in the dispense flow path 19 is then measured by the flow meter 21. Based on comparison of the measurement of the flow rate with the target flow rate, the controller 22 can adjust an amount of opening or closing of the valve 18 to achieve the target flow rate in the dispense flow path 19. For example, where the flow rate in the dispense flow path 19 is lower than the target flow rate, an amount of closure of the valve 18 can be increased, so that more of the liquid is diverted to the dispense flow path 19 and the flow rate in the dispense flow path 19 is therefore increased. Conversely, when the flow rate in the dispense flow path 19 is too high, an amount of opening of the valve 18 can be increased, so that less of the liquid is diverted to the dispense flow path 19 and the flow rate in the dispense flow path 19 is therefore decreased.

The valve 18, flow meter 21 and controller 22 therefore provide a control loop for controlling the flow rate in the dispense flow path 19.

Figure 5:
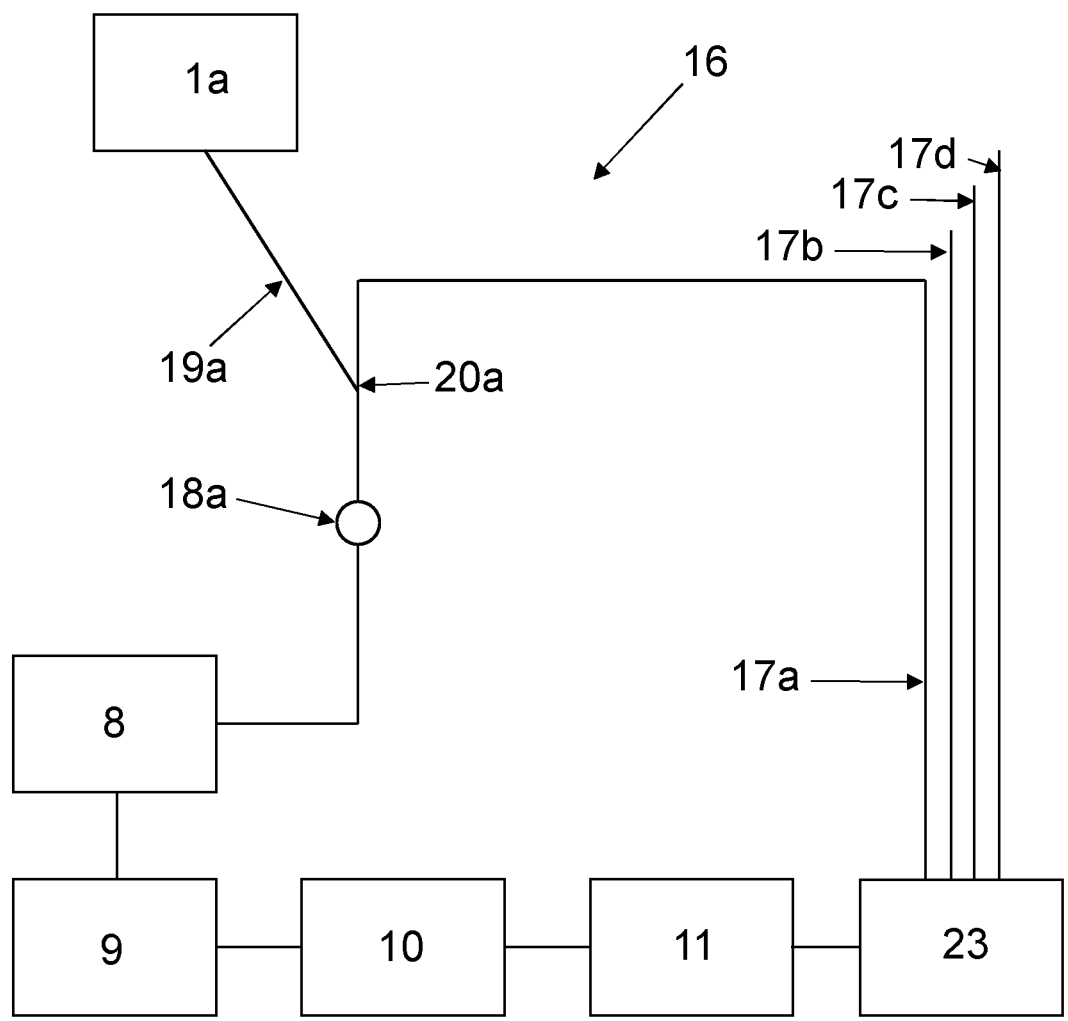
FIG. 5 is a schematic illustration of an apparatus for dispensing liquid according to an embodiment of the present invention.

An apparatus for dispensing a liquid to an apparatus for liquid treatment of a wafer according to a modified embodiment of the present invention is illustrated in FIG. 5. Features of this embodiment that correspond to features of the previous embodiments are indicated with the same reference numbers in FIG. 5, and detailed description thereof is omitted for conciseness.

This embodiment differs from the previous embodiment in that a plurality of loop flow paths 17a-17d are provided. Each of the loop flow paths 17a-17d is provided with a respective apparatus 1a that is connected to a respective junction 20a by a respective dispense flow path 19a. Furthermore, each of the plurality of loop flow paths 17a-17d includes a respective valve 18a positioned downstream of the junction 20a. For clarity, only one loop flow path 17a of the plurality of loop flow paths 17a-17d is illustrated in full in FIG. 5.

Each of the loop flow paths includes the same shared series connection of the tank 8, pump 9, heater 10 and filter 11, although as discussed above not all of these components needs to be included, and/or one or more of these components may be combined together.

In addition, in this embodiment a manifold 23 is provided that is connected to an outlet of the filter 11. The manifold 23 connects the outlet of the filter 11 to a plurality of separate flow paths, each of which is connected to the tank 8 to provide the plurality of loop flow paths 17a-17d.

The plurality of loop flow paths 17a-17d are therefore combined together in the series connection of the tank 8, pump 9, heater 10 and filter 11, but separate flow paths between the manifold 23 and the tank 8.

In this manner, liquid can independently be dispensed to each of a plurality of the apparatus 1a by independently controlling the valves 18a in the respective loop flow path 17a-17d.

In particular, the plurality of apparatus 1a can independently be provided with liquid while only requiring a single tank 8, pump 9, heater 10 and filter 11.

Of course, the apparatus 1a in each of the plurality of loop flow paths 17a-17d do not need to be identical to each other, and instead may be different liquid treatment apparatus. Alternatively, the apparatus 1a may all have the same configurations.

Four loop flow paths 17a-17d are illustrated in FIG. 5. However, the number of loop flow paths is not limited to four and can instead take any number.

Furthermore, in other embodiments the manifold 23 may be omitted and each of the plurality of separate flow paths may each be connected between the filter 11 and the tank 8.

In addition, or alternatively, in other embodiments each of the loop flow paths may have a respective filter 11, and/or a respective heater 10, and/or a respective pump 9.

Figure 6:
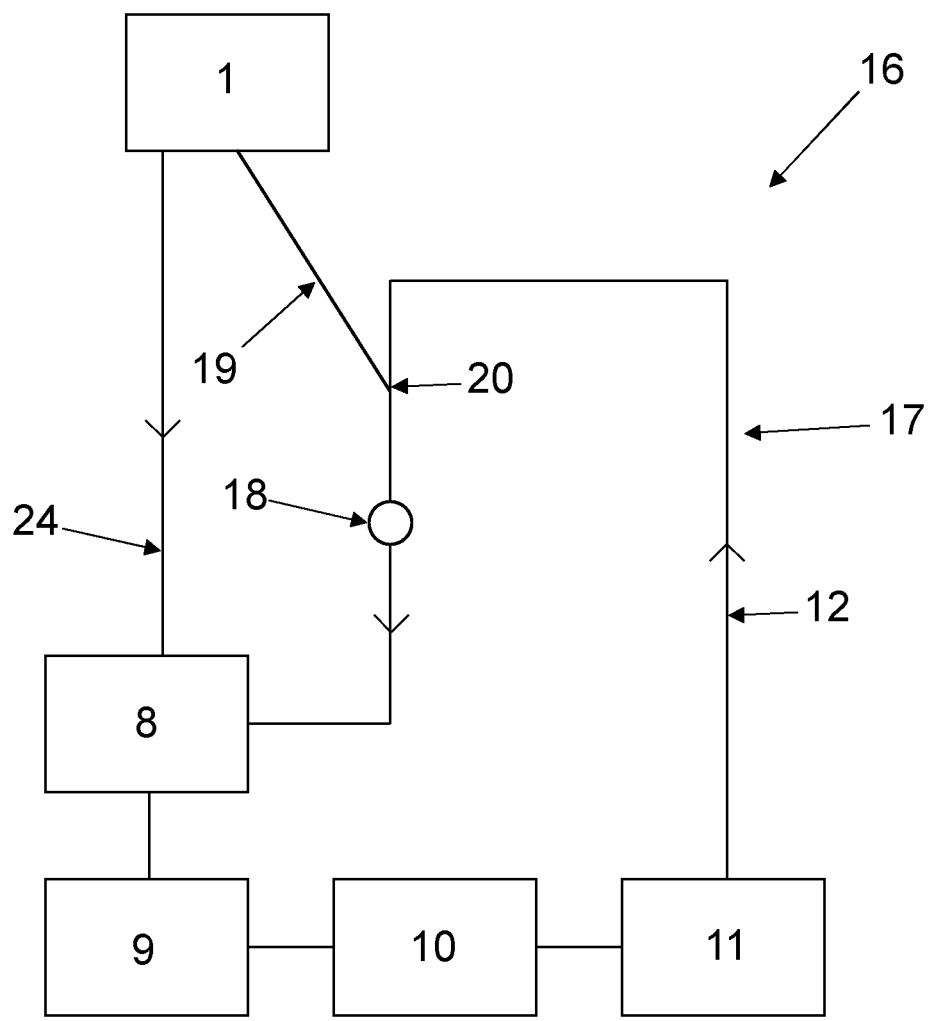
FIG. 6 is a schematic illustration of an apparatus for dispensing liquid according to an embodiment of the present invention.

An apparatus for dispensing a liquid to an apparatus for liquid treatment of a wafer according to a modified embodiment of the present invention is illustrated in FIG. 6. Features of this embodiment that correspond to features of the previous embodiments are indicated with the same reference numbers in FIG. 6, and detailed description thereof is omitted for conciseness.

This embodiment differs from the arrangement illustrated in FIG. 3 in that an additional flow path 24 is provided from the apparatus 1 to the tank 8. The additional flow path 24 collects liquid that has been dispensed by the apparatus 1 and returns the collected liquid to the tank 8. Of course, in other embodiments the liquid that has been dispensed by the apparatus 1 may instead be discarded, or collected in a different container.

Figure 7:
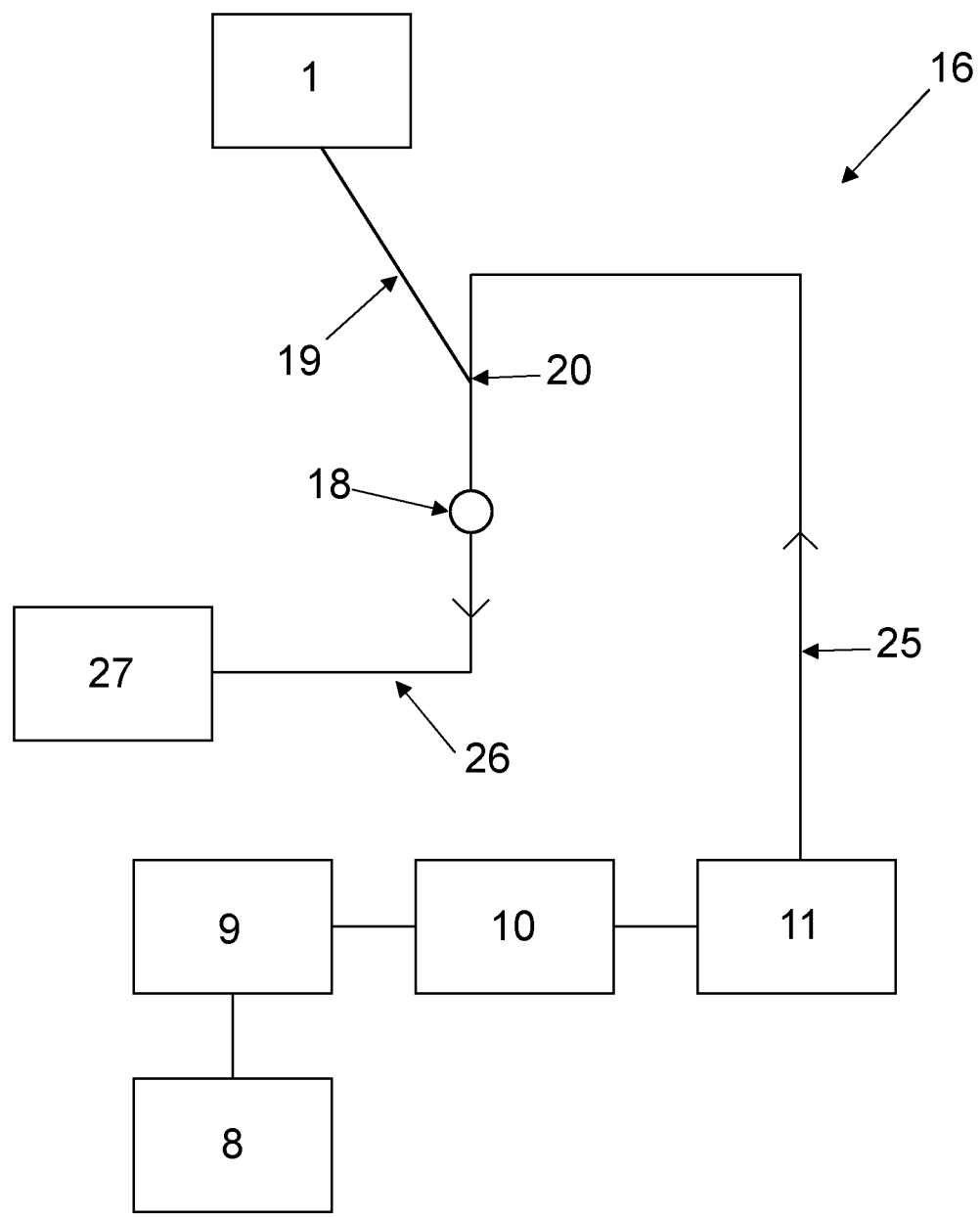
FIG. 7 is a schematic illustration of an apparatus for dispensing liquid according to an embodiment of the present invention.

An apparatus for dispensing a liquid to an apparatus for liquid treatment of a wafer according to a modified embodiment of the present invention is illustrated in FIG. 7. Features of this embodiment that correspond to features of the previous embodiments are indicated with the same reference numbers in FIG. 7, and detailed description thereof is omitted for conciseness.

This embodiment differs from the previous embodiments in that there is no loop flow path. Instead, a supply flow path 25 connects an outlet of the filter 11 to the junction 20. At the junction 20 the supply flow path 25 is branched (split or separated) into the dispense flow path 19 and a drain flow path 26.

The drain flow path 26 is connected to a container, apparatus or device 27, or some other external component. Therefore, liquid that is supplied to the supply flow path 25 and not dispensed by the dispense flow path 19 is supplied by the drain flow path 26 to the container, apparatus or device 27 and is not recirculated. However, the liquid may subsequently be recycled at or from the container, apparatus or device 27.

The operation of the apparatus according to this embodiment is the same as the other embodiments described above, with the difference that liquid that is not dispensed along the dispense flow path 19 is supplied to the container, apparatus or device 27 rather than returning via a return flow path to the tank 8.

Of course, as discussed above, in a modification of this embodiment the heater 10 and/or the filter 11 may be omitted. For example, the supply flow path 25 may be directly connected to an outlet of the pump 9.

In addition, or alternatively, in a modification of this embodiment a manifold may be provided in a similar manner to FIG. 5, wherein the manifold provides a plurality of the supply flow paths 25, each with a respective one of the junction 20, dispense flow path 19, drain flow path 26 and valve 18. The plurality of drain flow paths 26 may be connected to respective ones of the container, apparatus or device 27, or to the same one of the container, apparatus or device 27.

For example, the manifold may be provided after the filter 11, in a similar manner to FIG. 5.

Figure 8:
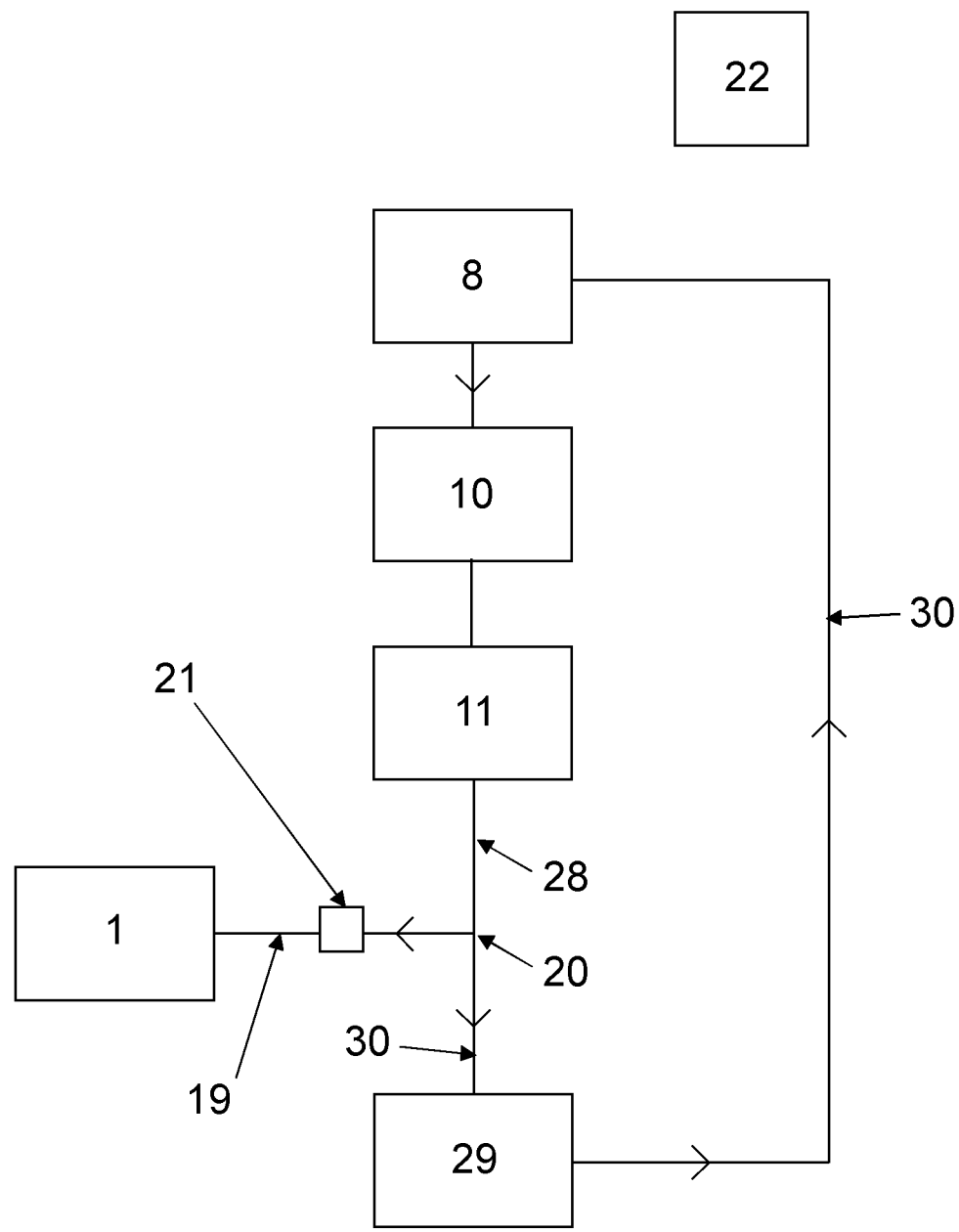
FIG. 8 is a schematic illustration of an apparatus for dispensing liquid according to an embodiment of the present invention.

FIG. 8 is a schematic illustration of an apparatus for dispensing liquid according to an embodiment of the present invention. Features of this embodiment that correspond to features of the previous embodiments are indicated with the same reference numbers in FIG. 8, and detailed description thereof is omitted for conciseness.

FIG. 8 differs from the previous embodiments in that the pump 9 is omitted. In this embodiment, the tank 8 containing the processing liquid is elevated above the other parts of the apparatus, to provide a pressurised liquid source.

A heater 10 and filter 11 are connected to the elevated tank 8 in series beneath the elevated tank 8. Therefore, liquid stored in the elevated tank 8 flows downwards through the heater 10 and filter 11 into a supply flow path 28 due to gravity. The liquid supplied to the supply flow path 28 is therefore pressurised due to hydrostatic pressure from the liquid in the elevated tank 8.

A pump 29 is located on a return flow path 30 downstream of the junction 20.

The pump 29 is operable to control a flow rate of the liquid flowing in the return flow path 30.

For example, when the pump 29 is off, flow of liquid through the return flow path 30 may be prevented, or may be limited or restricted. In that case, some or all of the liquid flowing to the junction 20 from the supply flow path 28 will flow along the dispense flow path 19 to the apparatus 1.

In contrast, when the pump 29 is operated to apply force or pressure to the liquid in the return flow path 30, the flow rate of the liquid in the return flow path 30 is increased. Increasing the flow rate of the liquid in the return flow path 30 will decrease a flow rate of the liquid in the dispense flow path 19. If the flow rate of the liquid in the return flow path 30 is sufficiently increased, substantially no liquid will flow along the dispense flow path 19 to the apparatus 1.

In this embodiment, the flow meter 21 on the dispense flow path 19 and the controller 22 are provided. The controller controls an amount of operation (or degree of operation) of the pump 29 (for example an amount of force or pressure applied to the liquid by the pump 29) based on a measured flow rate in the dispense flow path 19 by the flow meter 21 and a target flow rate in the dispense flow path 19.

For example, if the measured flow rate in the dispense flow path 19 is less than the target amount, an amount or degree of operation of the pump 29 may be decreased, so that the flow rate in the return flow path 30 is decreased and the flow rate in the dispense flow path 19 is increased.

Conversely, if the measured flow rate in the dispense flow path 19 is more than the target amount, an amount or degree of operation of the pump may be increased, so that the flow rate in the return flow path 30 is increased and the flow rate in the dispense flow path 19 is decreased.

Of course, in an alternative embodiment the pump 29 may be provided on a drain flow path as previously discussed rather than a return flow path. In that case, liquid on the drain flow path is not returned to the elevated tank 8 by the pump 29 and is instead discharged or drained.

In addition, in an alternative embodiment the flow meter 21 and controller 22 may be omitted and the pump 29 may instead be controlled to be merely either on or off.

Of course, in an alternative embodiment the tank 8 may not be an elevated tank 8, and instead the pump 9 of the previous embodiments may be provided to supply pressurised liquid from the tank 8 to the supply flow path 28.

Of course, the different embodiments described above can be combined together in different arrangements.

For example, the apparatus in any of the embodiments can include the feedback loop of FIG. 4, including the flow meter 21 and controller 22.

In addition, or alternatively, the apparatus in any of the embodiments can include the additional flow path 24 of FIG. 6.

In addition, or alternatively, the apparatus in any of the embodiments can include the manifold 23 that provides a plurality of flow paths from a single flow path.

As discussed above, in any of the embodiments the heater 10 and/or the filter 11 can be omitted, or where present these parts may be located in different locations to those shown in the figures.

In addition, or alternatively, in any of the embodiments the valve 18 can be replaced with a pump 29.

In addition, or alternatively, in any of the embodiments the combination of the pump 9 and tank 8 can be replaced with an elevated tank 8, in which the pressure of the pressurised liquid is due to hydrostatic pressure.

Figure 9:
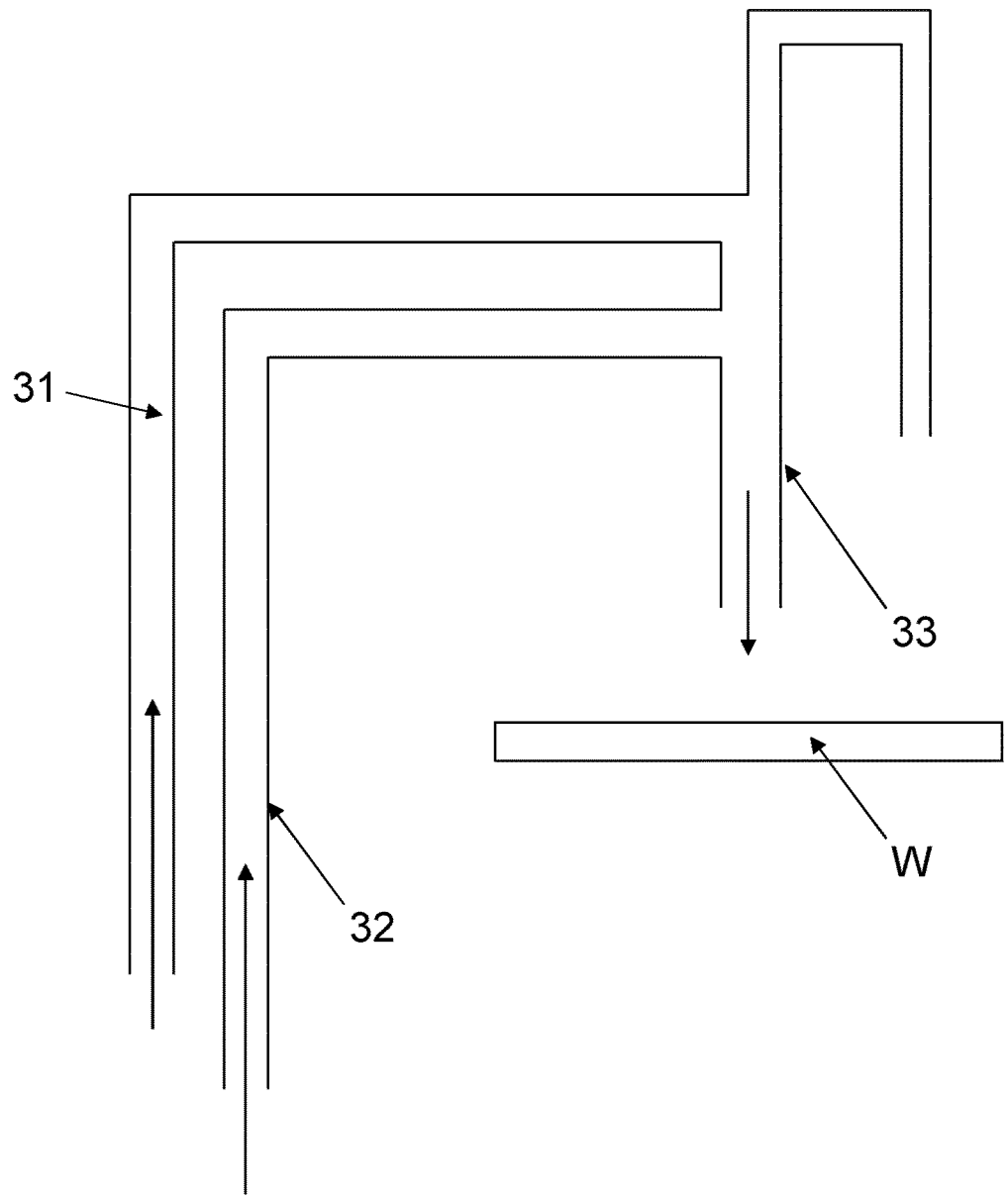
FIG. 9 is a schematic illustration of an application of the apparatus of the present invention to inline mixing of different liquids.

FIG. 9 is an embodiment of the present invention in which the apparatus according to any of the embodiments described above is applied to inline mixing of different liquids.

As shown in FIG. 9, in this embodiment a first flow path 31 and a second flow path 32 are merged together (joined together, or combined together) to form a mixed flow path 33. Therefore, if a first liquid flows along the first flow path 31 and a second liquid flows along the second flow path 32, the first and second liquids are mixed together in the mixed flow path 33.

The mixture of the first and second liquids can then be dispensed onto the surface of a wafer W, for example.

For example, the first flow path 31 and the second flow path 32 may be merged together in a liquid dispenser of an apparatus for liquid treatment of a wafer, for example in the nozzle of the liquid dispenser. The mixed flow path 33 may be provided in the nozzle and may dispense the mixture of the first and second liquids from the nozzle onto the wafer W.

The first and second liquids may be different liquids, for example different compositions, or they may be the same liquid but differ in one or more properties such as temperature.

The first flow path 31 may correspond to, or be connected to, the dispense flow path 19 of the apparatus according to any of the previous embodiments.

Alternatively, the second flow path 32 may correspond to, or be connected to, the dispense flow path 19 of the apparatus according to any one of the previous embodiments.

In one embodiment, both the first flow path 31 and the second flow path 32 may be connected to respective dispense flow paths 19, wherein the respective dispense flow paths 19 are provided by a single apparatus according to any one of the previous embodiments, or by different apparatus according to any one of the previous embodiments.

Where the first flow path 31 corresponds to, or is connected to, the dispense flow path 19 of the apparatus, the flow rate of the first liquid in the first flow path 31 can be controlled by controlling the corresponding valve 18 on the corresponding loop flow path 17 or corresponding drain flow path 26. Therefore, an amount of the first liquid that is mixed with the second liquid in the mixed flow path 33 can be controlled.

In addition, or alternatively, where the second flow path 30 corresponds to, or is connected to, the dispense flow path 19 of the apparatus, the flow rate of the second liquid in the second flow path 32 can be controlled by controlling the corresponding valve 18 on the corresponding loop flow path 17 or corresponding drain flow path 26. Therefore, an amount of the second liquid that is mixed with the first liquid in the mixed flow path 33 can be controlled.

As mentioned above, the flow rates of both the first liquid in the first flow path 31 and the second liquid in the second flow path 32 may be controlled by respective corresponding valves 18, to control the amounts of both the first liquid and the second liquid mixed in the mixed flow path 33.

Therefore, controllable mixing of the first and second liquids in the mixed flow path 33 can be achieved.

The mixed flow path 33 may be substantially vertical.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

For the avoidance of any doubt, any theoretical explanations provided herein are provided for the purposes of improving the understanding of a reader. The inventors do not wish to be bound by any of these theoretical explanations.

Any section headings used herein are for organizational purposes only and are not to be construed as limiting the subject matter described.

Throughout this specification, including the claims which follow, unless the context requires otherwise, the word "comprise" and "include", and variations such as "comprises", "comprising", and "including" will be understood to imply the inclusion of a stated integer or step or group of integers or steps but not the exclusion of any other integer or step or group of integers or steps.

It must be noted that, as used in the specification and the appended claims, the singular forms "a," "an," and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by the use of the antecedent "about," it will be understood that the particular value forms another embodiment. The term "about" in relation to a numerical value is optional and means for example +/−10%.

The invention claimed is:

1. An apparatus for dispensing a liquid comprising:
  a supply flow path;
  a pressurised liquid source arranged to supply pressurised liquid to the supply flow path;
  a junction downstream of the pressurised liquid source, wherein at the junction the supply flow path is branched into a dispense flow path and a return or drain flow path; and
  a valve or pump in the return or drain flow path downstream of the junction,
  wherein the junction is configured so that when the pressurised liquid is supplied to the supply flow path, and the valve or pump is operated in a predetermined manner, the liquid flows into the return or drain flow path, and flow of the liquid into the dispense flow path is prevented or restricted.

2. The apparatus according to claim 1, wherein:
  the junction includes a narrowing or constriction between the supply flow path and the return or drain flow path, wherein a velocity of the liquid flowing from the supply flow path to the return or drain flow path is increased in the narrowing or constriction and a pressure of the liquid flowing from the supply flow path to the return or drain flow path is reduced in the narrowing or constriction; and the narrowing or constriction is arranged so that the reduced pressure prevents or restricts flow of the liquid into the dispense flow path.

3. The apparatus according to claim 1, wherein the dispense flow path is oriented so that gravity acts on the liquid to prevent or restrict the liquid from flowing from the junction along the dispense flow path.

4. The apparatus according to claim 1, wherein at the junction the dispense flow path is oriented:
substantially vertically; or
angled upwards at an angle of less than 10 degrees to the vertical; or
angled upwards at an angle of less than 20 degrees to the vertical; or
angled upwards at an angle of less than 30 degrees to the vertical; or
angled upwards at an angle of less than 40 degrees to the vertical; or
angled upwards at an angle of less than 50 degrees to the vertical; or
angled upwards at an angle of less than 60 degrees to the vertical.

5. The apparatus according to claim 1, wherein the supply flow path and/or the return or drain flow path is oriented so that gravity acts on the liquid to prevent or restrict the liquid from flowing from the junction along the dispense flow path.

6. The apparatus according to claim 1, wherein at an inlet to the junction the supply flow path is oriented:
substantially vertically downward; or
angled downward at an angle of less than 10 degrees to the vertical; or
angled downward at an angle of less than 20 degrees to the vertical; or
angled downward at an angle of less than 30 degrees to the vertical; or
angled downward at an angle of less than 40 degrees to the vertical; or
angled downward at an angle of less than 50 degrees to the vertical; or
angled downward at an angle of less than 60 degrees to the vertical.

7. The apparatus according to claim 1, wherein at an outlet of the junction the return or drain flow path is oriented:
substantially vertically downward; or
angled downward at an angle of less than 10 degrees to the vertical; or
angled downward at an angle of less than 20 degrees to the vertical; or
angled downward at an angle of less than 30 degrees to the vertical; or
angled downward at an angle of less than 40 degrees to the vertical; or
angled downward at an angle of less than 50 degrees to the vertical; or
angled downward at an angle of less than 60 degrees to the vertical.

8. The apparatus according to claim 1, wherein at the junction the dispense flow path is angled relative to a direction of flow of the liquid in the supply flow path so as to prevent or restrict the liquid from flowing from the junction along the dispense flow path.

9. The apparatus according to claim 1, wherein at the junction the dispense flow path is angled relative to the direction of flow of the liquid in the supply flow path by an angle of more than 90 degrees, or more that 100 degrees, or more than 110 degrees, or more than 120 degrees, or more than 130 degrees, or more than 140 degrees, or more than 150 degrees, or more than 160 degrees, or more than 170 degrees.

10. The apparatus according to claim 1, wherein the pressurised liquid source comprises a pump.

11. The apparatus according to claim 1, wherein the pressurised liquid source comprises a container of the liquid.

12. The apparatus according to claim 1, wherein the pressurised liquid source comprises a container of the liquid at an elevated position.

13. The apparatus according to claim 1, wherein the apparatus comprises a filter arranged to filter particles from the pressurised liquid supplied to the supply flow path, the filter being upstream of the junction.

14. The apparatus according to claim 1, wherein:
at the junction the supply flow path is branched into the dispense flow path and the return flow path; and
the supply flow path and the return flow path are parts of a loop flow path around which the liquid is circulated.

15. The apparatus according to claim 1, wherein:
at the junction the supply flow path is branched into the dispense flow path and the drain flow path; and
the drain flow path supplies the liquid to a container, or to another apparatus, or to another device.

16. The apparatus according to claim 1, wherein the junction comprises a Y-fitting or a T-fitting.

17. The apparatus according to claim 1, wherein:
the apparatus comprises a flow meter arranged to measure a flow rate of the liquid flowing through the dispense flow path;
the valve or pump is operable to adjust a flow rate of the liquid flowing in the return or drain flow path; and
the apparatus comprises a controller that is configured to control the valve or pump to adjust the flow rate of the liquid flowing in the return or drain flow path based on a measurement output of the flow meter.

18. The apparatus according to claim 17, wherein the controller is configured to control the valve or pump to adjust the flow rate of the liquid flowing in the return or drain flow path to achieve a target flow rate of the liquid flowing through the dispense flow path.

19. The apparatus according to claim 1, wherein the apparatus comprises a plurality of the supply flow paths, each with a respective one of the junction, dispense flow path, return or drain flow path and valve.

20. The apparatus according to claim 19, wherein the plurality of supply flow paths are provided by a manifold that is located downstream of the pressurised liquid source.

21. The apparatus according to claim 1, comprising an apparatus for liquid treatment of a wafer connected to the dispense flow path.

22. A system for supplying liquid to an apparatus for liquid treatment of a wafer, comprising:
the apparatus according to claim 1; and
an apparatus for liquid treatment of a wafer connected to the dispense flow path.

* * * * *